United States Patent
Peterson et al.

(10) Patent No.: US 7,148,452 B2
(45) Date of Patent: Dec. 12, 2006

(54) HEAT SINK FOR PRINTED CIRCUIT BOARD COMPONENTS

(75) Inventors: Gregory A. Peterson, South Barrington, IL (US); Jeffrey S. Stebner, Roselle, IL (US)

(73) Assignee: Emerson Electric Co., St. Louis, MO (US)

( * ) Notice: Subject to any disclaimer, the term of this patent is extended or adjusted under 35 U.S.C. 154(b) by 813 days.

(21) Appl. No.: 09/825,499

(22) Filed: Apr. 3, 2001

(65) Prior Publication Data

US 2002/0170905 A1 Nov. 21, 2002

(51) Int. Cl.
*H05B 3/68* (2006.01)
*F28F 7/00* (2006.01)

(52) U.S. Cl. .................. 219/443.1; 165/80.3
(58) Field of Classification Search ............. 219/443.1, 219/448.12, 452.11, 460.1; 165/80.2, 80.3; 361/687, 690, 694, 695, 696, 697
See application file for complete search history.

(56) References Cited

U.S. PATENT DOCUMENTS

| | | | | |
|---|---|---|---|---|
| 1,519,673 A | * | 12/1924 | Doble | 126/90 R |
| 2,930,405 A | * | 3/1960 | Welsh | 138/38 |
| 3,149,666 A | * | 9/1964 | Coe | 165/121 |
| 3,277,346 A | * | 10/1966 | McAdam et al. | 361/697 |
| 4,368,777 A | * | 1/1983 | Grasso | 165/154 |
| 4,459,638 A | * | 7/1984 | Brehm et al. | 361/697 |
| 4,695,924 A | * | 9/1987 | Wozniczka | 361/720 |
| 5,235,491 A | | 8/1993 | Weiss et al. | 361/694 |
| 5,304,735 A | * | 4/1994 | Earl et al. | 174/16.3 |
| 5,446,268 A | * | 8/1995 | Chen | 219/623 |
| 5,717,189 A | * | 2/1998 | Goetz et al. | 219/483 |
| 5,828,549 A | * | 10/1998 | Gandre et al. | 361/695 |
| 6,219,242 B1 | * | 4/2001 | Martinez | 361/704 |
| 6,339,212 B1 | * | 1/2002 | Campbell | 219/460.1 |
| 6,352,103 B1 | * | 3/2002 | Chu et al. | 165/80.3 |

FOREIGN PATENT DOCUMENTS

| | | |
|---|---|---|
| GB | 2 059 569 A | 4/1981 |
| JP | 05 114471 A | 5/1993 |

OTHER PUBLICATIONS

European Search Report for Corresponding European Patent Application No. 02076290.2 (EP 1 248 506), dated Sep. 8, 2005.

* cited by examiner

*Primary Examiner*—Sang Y. Paik
(74) *Attorney, Agent, or Firm*—Locke Liddell & Sapp

(57) ABSTRACT

The present invention provides a heat sink for cooling a component. The component may be one of several components on a circuit board. The heat sink includes a tubular body and a plurality of internal fins. The tubular body has an interior surface and an exterior surface. At least a portion of the exterior surface being substantially flat. The plurality of internal fins extend from the internal surface and are generally symmetric around a center line of the tubular body. The substantially flat portion of the tubular body contacts the component to remove heat from the component. The heat sink may further include a plurality of exterior fins extending from the exterior surface of the tubular body.

16 Claims, 5 Drawing Sheets

HEAT SINK FOR PRINTED CIRCUIT BOARD COMPONENTS

FIELD OF THE INVENTION

The present invention relates generally to heat sinks, and more particularly, to a heat sink attached to a circuit board for cooling components on the circuit board.

BACKGROUND OF THE INVENTION

A conventional glass-ceramic cook top has several electric heating units mounted below a glass-ceramic cooking plate. The cook top also has a circuit board to control the electric heating units. The circuit board is typically located below the glass-ceramic cooking plate. Most components on the circuit board, especially semiconductor components, are sensitive to high temperatures and must be kept below a maximum temperature to operate properly. Commonly used semiconductor components for cook tops are triacs and/or silicon-controlled rectifiers (SCRs). Triacs and SCRs are semiconductor devices that function as electrically controlled switches.

To cool sensitive components such as triacs and SCRs on the circuit board, conventional cook tops typically have a housing unit with a fan. The circuit board is retained in the housing unit. The fan is mounted to an opening in the housing unit to circulate air and to cool components on the circuit board. Although the fan will assist in cooling the circuit board and its components, there is a continuing need for more efficient and direct cooling means. For example, triacs come in different types and sizes. Conventional cook tops use triacs with relatively high maximum temperatures. Triacs with high maximum temperatures are expensive. Triacs are one of the most expensive components on the circuit board. Thus, a better cooling device would enable the use of lower cost triacs thereby reducing the overall cost of the circuit board.

Moreover, relying solely on a fan mounted to the housing unit provides certain limitations on a user when the user needs to replace a failed circuit board. The size and type of cooling fan is selected based on the size and type of circuit board. If a replacement circuit board has additional or different types of components, the fan on the housing unit may be inadequate for the replacement circuit board. Thus, a further need exists for a cooling device capable of being attached to the circuit board.

The present invention is directed to overcoming, or at least reducing the effects of, one or more of the problems set forth above.

SUMMARY OF THE INVENTION

To that end, the present invention includes a heat sink for cooling a component. The heat sink includes a tubular body and a plurality of internal fins. The tubular body has an interior surface and an exterior surface. At least a portion of the exterior surface being substantially flat. The plurality of internal fins extend from the internal surface and are generally symmetric around a center line of the tubular body. The substantially flat portion of the tubular body contacts the component to remove heat from the component. The heat sink is made of a heat conducting material such as aluminum.

The heat sink may have two open ends where a fan is attached to one open end. The plurality of internal fins may have varying lengths to increase the number of fins that extend from the internal surface of the heat sink. The heat sink may further include a plurality of external fins that extend from the exterior surface of the heat sink.

Another embodiment of the present invention is a heat sink assembly for cooling a component on a circuit board. The heat sink assembly includes a tubular body and a fan. The tubular body has an interior surface, an exterior surface and two open ends. At least a portion of the exterior surface is substantially flat. The interior surface has a plurality of internal fins extending from the interior surface of the tubular body. The internal fins are generally symmetric around a center line of the tubular body. The fan is attached to one of the two open ends of the tubular body to force ambient air through the tubular body. The substantially flat portion of the tubular body contacts the component to remove heat from the component.

A further embodiment of the present invention is a cooktop having a cooking plate, a plurality of heating units, a controller housing unit, a circuit board and a heat sink assembly. The plurality of heating units and controller housing unit are mounted below the cooking plate. The circuit board and heat sink are mounted inside the controller housing unit. The circuit board controls the heating units and has a plurality of components. The heat sink assembly provides cooling to the plurality of components and is attached to the circuit board. The heat sink assembly including a tubular body and a fan. The tubular body has an interior surface, an exterior surface and two open ends. The interior surface has a plurality of internal fins extending from the interior surface of the tubular body. The fan is attached to one of the two open ends of the tubular body to force ambient air through the tubular body. The exterior surface of the tubular body contacts the plurality of components to remove heat from the components.

The above summary of the present invention is not intended to represent each embodiment, or every aspect of the present invention. This is the purpose of the figures and detailed description that follows.

BRIEF DESCRIPTION OF THE DRAWINGS

Other objects and advantages of the invention will become apparent upon reading the following detailed description and upon reference to the drawings.

Figure 1:
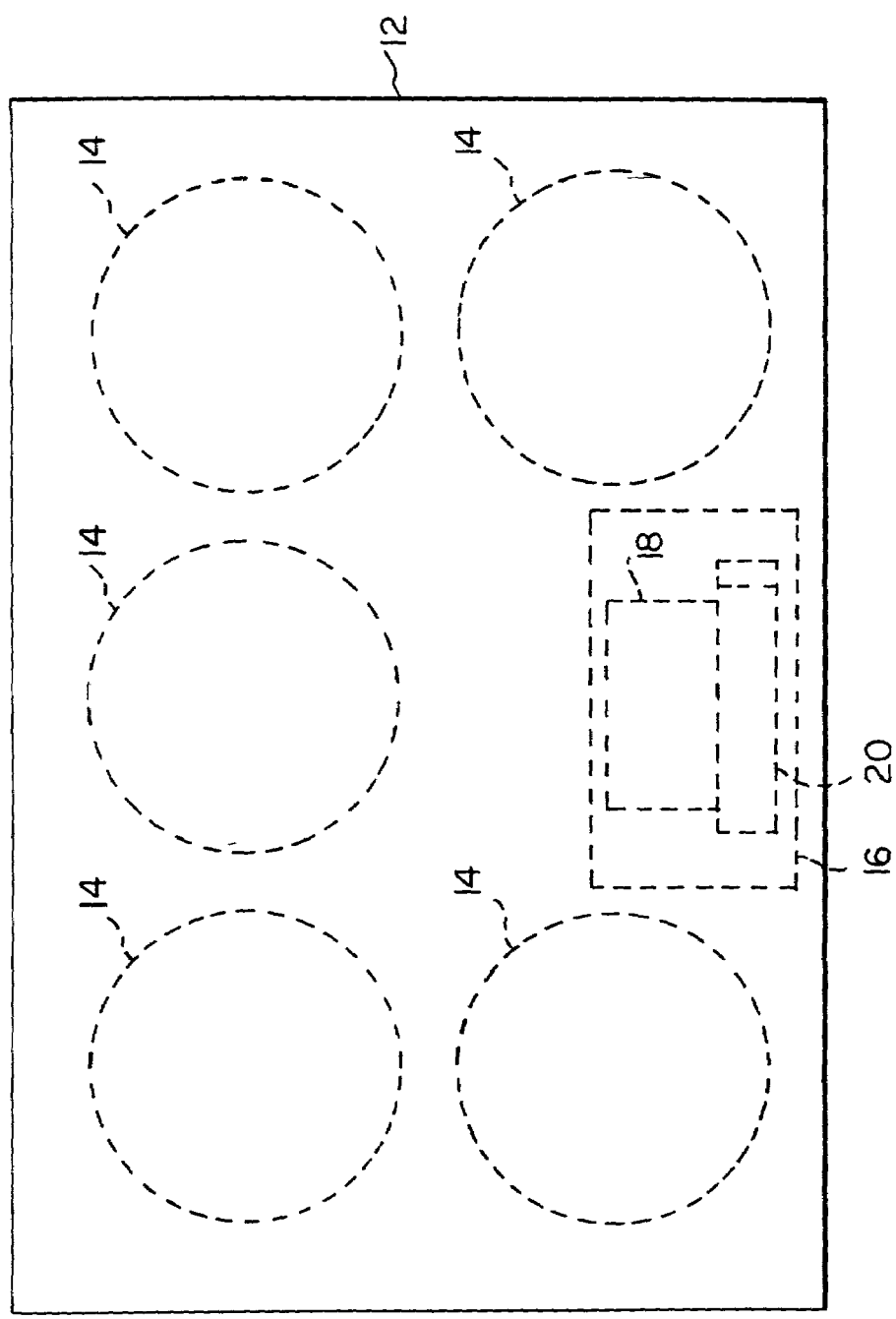
FIG. 1 is a top view of a cook top having multiple heating units, a circuit board, and a heat sink of the present invention for cooling components on the circuit board.

While the invention is susceptible to various modifications and alternative forms, certain specific embodiments thereof have been shown by way of example in the drawings and will be described in detail. It should be understood, however, that the intention is not to limit the invention to the particular forms described. On the contrary, the intention is to cover all modifications, equivalents, and alternatives falling within the spirit and scope of the invention as defined by the appended claims.

DESCRIPTION OF ILLUSTRATIVE EMBODIMENTS

Illustrative embodiments will now be described with reference to the accompanying figures. Turning to the drawings, FIG. 1 depicts a cook top 10 having a glass-ceramic plate 12, a plurality of heating units 14, a controller housing unit 16, a circuit board 18 and a heat sink assembly 20. The heating units 14 generate heat to cook a pan or other utensil (not shown) set on top of the glass-ceramic plate 12. The heating units 14 are mounted below the glass-ceramic plate 12 and are controlled by the circuit board 18. The circuit board 18 and heat sink assembly 20 are retained in the controller housing unit 16. The controller housing unit 16 may be shaped as a square pan with openings or holes (not shown) on the side of the pan to allow air to circulate within the controller housing unit 16. Unlike conventional cook tops, the controller housing unit 16 does not need a fan to force air through the heating unit 16.

Figure 2:
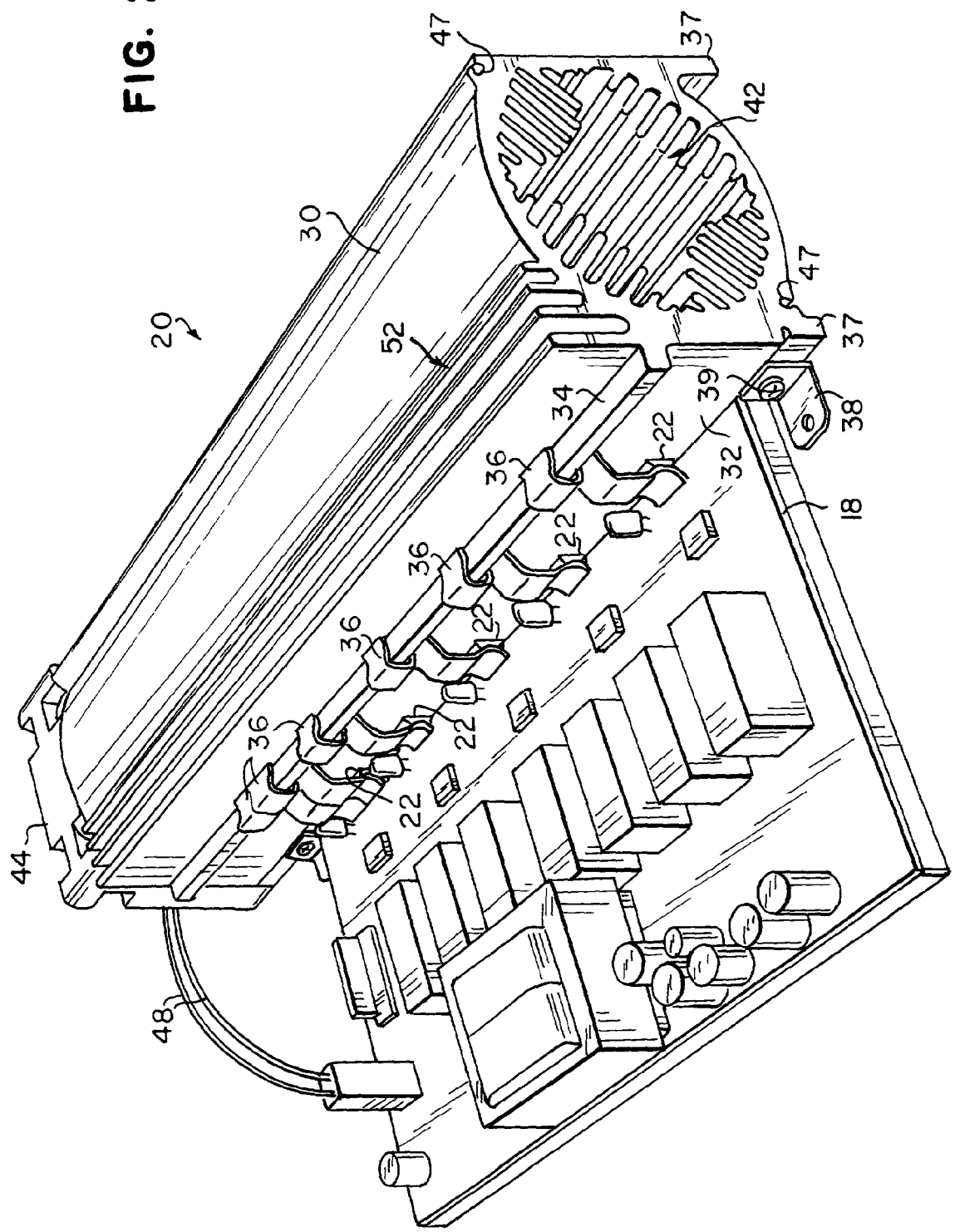
FIG. 2 is a perspective view of one embodiment of a heat sink of the present invention attached to a circuit board.

As shown in FIG. 2, the circuit board 18 has a plurality of components to monitor the temperature of the heating units 14 and to control the power provided to the elements that generate heat within the heating units 14. There are different types of components on the circuit board 18 such as fuses, varistors, resistors, capacitors and switches. Most components have maximum temperatures to operate properly and reliability. The most sensitive type of components for cook tops, however, are components made from silicon. Common silicon based components are triacs and SCRs. Triacs and SCRs are semiconductor devices that function as electrically controlled switches. FIG. 2 illustrates a circuit board 18 having a plurality of triacs 22. A separate triac 22 is used for controlling each heating unit 14.

As explained earlier, different types of triacs may be obtained from commercial sources. The price of a triac is typically a function of how sensitive the device is to heat, i.e. its maximum operating temperature. Triacs with higher maximum operating temperatures are more expensive than triacs with lower maximum operating temperatures. The present invention provides a means to directly cool triacs on a circuit board. This allows the circuit board to use triacs with lower maximum operating temperatures, thereby reducing the overall cost of the circuit board.

FIG. 2 illustrates one embodiment of heat sink assembly 20 of the present invention. A heat sink 30 is attached to the circuit board 18 to dissipate heat for certain components on the circuit board 18. In this embodiment, the heat sink 30 removes heat from a plurality of triacs 22. The heat sink 30 is attached to one end of the circuit board 18. The triacs 22 are mounted to the circuit board at the same end as the heat sink 30. The heat sink 30 is preferably formed from a single extrusion of thermally conductive material such as a metal. In one embodiment, the heat sink 30 is made of aluminum alloy 6063-T5.

Figure 3:
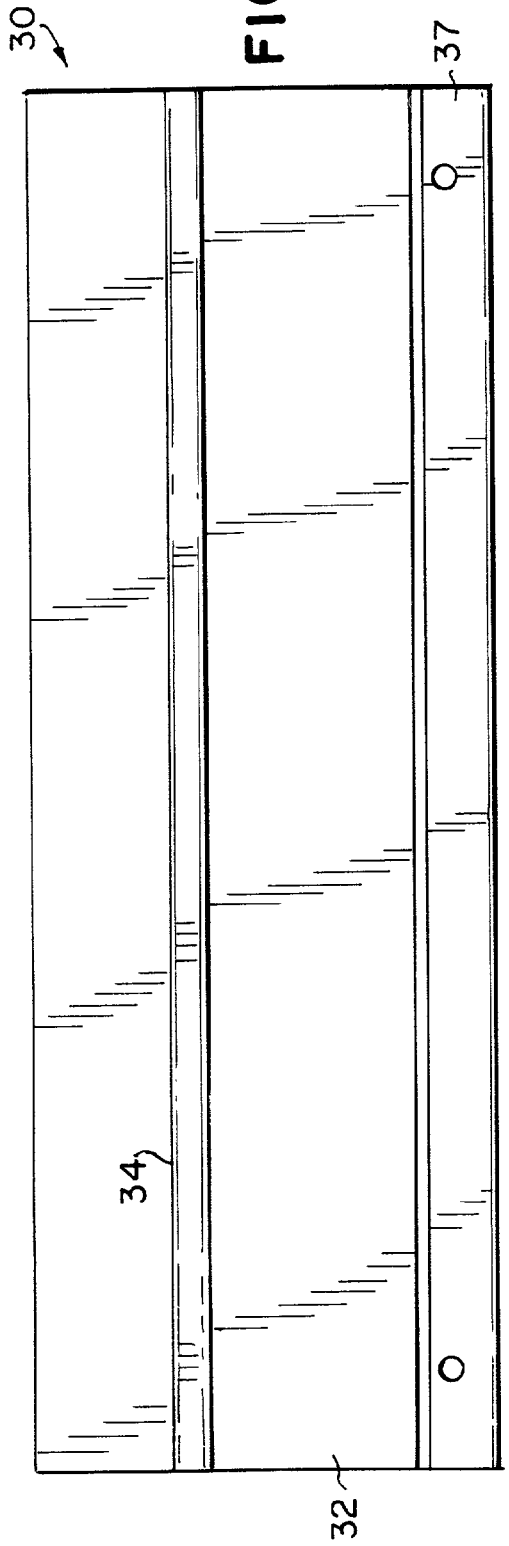
FIG. 3 is an end view of the heat sink in FIG. 2.

As shown in FIGS. 2 and 3, the heat sink 30 has at least one generally flat side 32 and a mounting ridge 34. The generally flat side 32 is used for contacting the triacs 22 and dissipating heat. The mounting ridge 34 is used as a mounting surface for fasteners or clips 36. The fasteners and clips 36 are used to retain the triacs 22 against the generally flat side 32 of the heat sink 30. A thermally conductive adhesive may also be used to secure the triacs 22 against the generally flat side 32 of the heat sink 30.

The heat sink 30 may also have legs 37 to allow the heat sink 30 to rest on the bottom of the controller housing unit 16. Brackets 38 and screws 39 may further be used to mount the heat sink 30 to the bottom of the controller housing unit 16.

Figure 4:
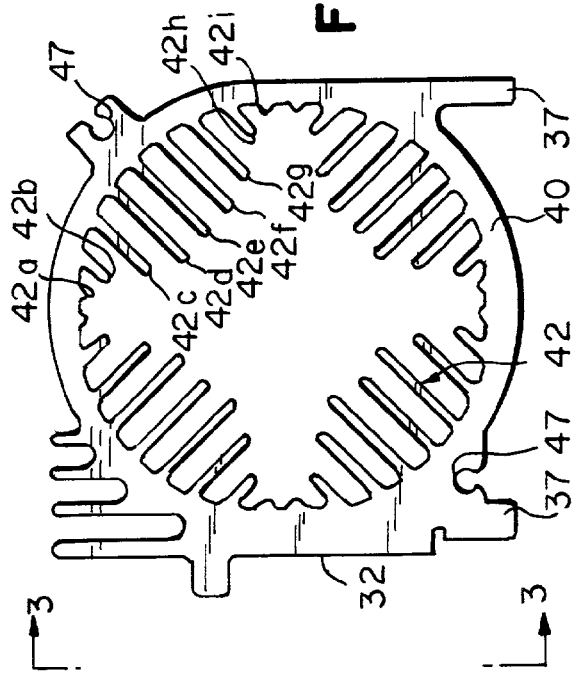
FIG. 4 is a side view of the heat sink in FIG. 2.

FIG. 4 illustrates an end view of the heat sink 30. The heat sink 30 has a tubular body 40 with internal fins 42. The internal fins 42 radiate from the internal surface of the tubular body 40 and are generally symmetric around the center line of the tubular body 40.

In one embodiment, the internal fins 42 comprise of four sets of fins 42a–42i. The fins in each set have varying lengths. The fins in the center of the set are longer than the fins at the edges of each set. The varying sizes of fins 42 permits a greater number of fins to protrude from the inner surface of the tubular body 40. For example, in the embodiment shown in FIG. 4, each set has center fins ($42c$, $42d$, $42e$, $42f$, $42g$) that are longer than the fins at the edges of the set ($42a$, $42b$, $42h$, and $42i$). In particular, in one embodiment where the internal diameter of the tubular body 40 is 22 inches, the length of the fins include:

| Fin | Length (inches) |
|---|---|
| 42a | 0.090 |
| 42b | 0.225 |
| 42c | 0.450 |
| 42d | 0.590 |
| 42e | 0.580 |
| 42f | 0.590 |
| 42g | 0.450 |
| 42h | 0.225 |
| 42i | 0.090 |

The present invention is not limited to these dimensions or lengths. One of ordinary skill in the art, with the benefit of this disclosure, would realize that other dimensions and lengths could be used without departing from the present invention. What is important is that multiple fins protrude from the interior surface of the tubular body so that a greater surface area exists for convection cooling as described in more detail below.

Figure 5:
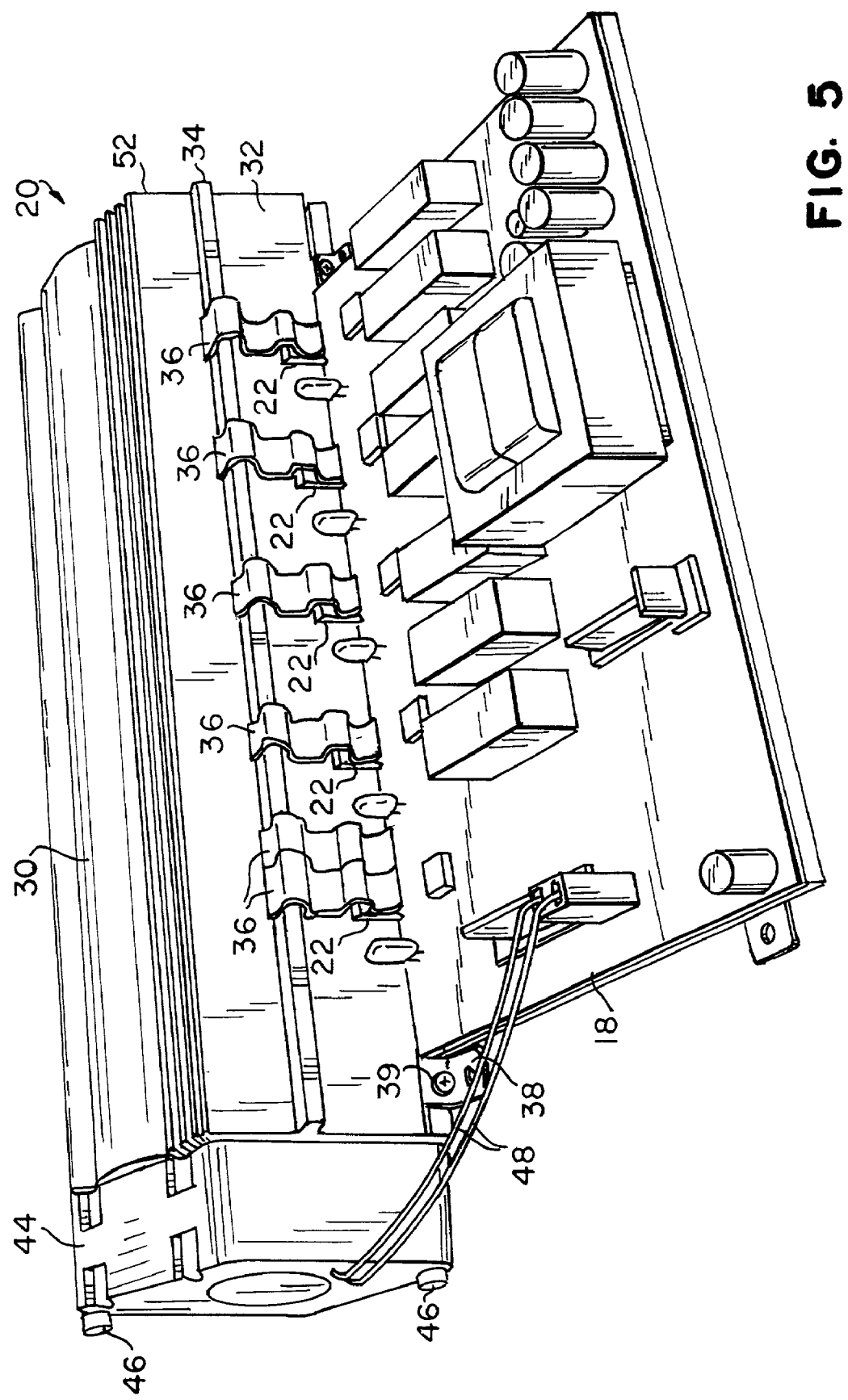
FIG. 5 is another perspective view of the heat sink and circuit board in FIG. 2.
Figure 6:
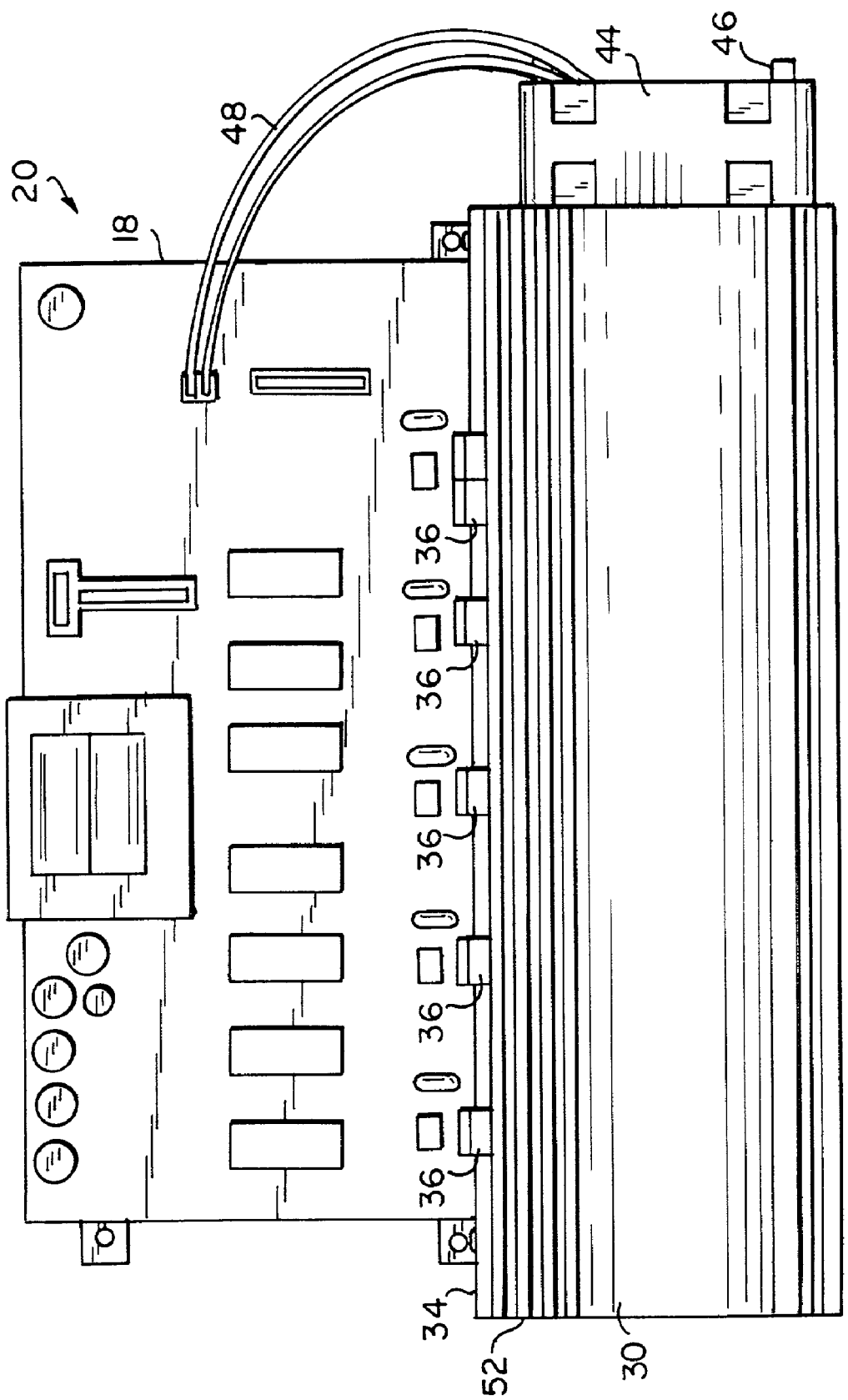
FIG. 6 is a top view of the heat sink and circuit board in FIG. 2.

As shown in FIG. 5, a fan 44 is attached to one end of the heat sink 30. The fan 44 may be attached to the heat sink 30 by screws 46. The screws 46 are inserted into screw holes 47 on the body of the heat sink 30. The fan 44 is electrically driven and is connected to a power source by a pair of wires 48. The fan 44 forces ambient air through the heat sink 30. The air is forced over the internal surface of the tubular body 40 and over the internal fins 42. The high fin surface area is very effective in removing heat by active convection from the heat sink 30.

To provide additional convection cooling, the heat sink 30 may also have external fins 52 that extend from at least a portion of the external surface of the tubular body. As mentioned above, the controller housing unit 16 does not need a fan that forces ambient air to circulate within the housing unit 16. The external fins 52 provide an additional means for dissipating heat through convection.

What has been described is a heat sink for cooling temperature sensitive components such as triacs and SCRs on a circuit board. The design of the fin layout in the present invention provides very effective heat removal and allows components with lower maximum operating temperatures to be used in the system. The maximum operating temperature of a component is typically a factor in the price of the component. The heat sink of the present invention allows less expensive components to be used on the circuit board.

In view of the foregoing, it will be seen that the several objects of the invention are achieved and other advantageous results are obtained.

As various changes could be made in the above constructions without departing from the scope of the invention, it is intended that all matter contained in the above description or shown in the accompanying drawings shall be interpreted as illustrative and not in a limiting sense.

What is claim is:

1. A heat sink for cooling a component, the heat sink comprising:
   a tubular body formed from a single extrusion of thermally conductive material having an interior surface and an exterior surface, at least a portion of the exterior surface defining a substantially flat side that defines a plane oriented generally tangential to the tubular body;
   a plurality of internal fins extending from the interior surface of the tubular body; and
   a mounting ridge extending from the flat side and oriented generally perpendicular to the flat side, the mounting ridge receiving a clip to hold the component against the substantially flat side of the tubular body.

2. The heat sink of claim 1, wherein the internal fins are generally symmetric around a center line of the tubular body.

3. The heat sink of claim 2, wherein the fins in a center of a set are longer than the fins at an edge of a set.

4. The heat sink of claim 1 further comprising a plurality of exterior fins extending from the exterior surface of the tubular body.

5. The heat sink of claim 4, further comprising a fan positioned adjacent to an open end of the tubular body.

6. A heat sink assembly for cooling a component on a circuit board, the heat sink assembly comprising:
   a tubular body formed from a single extrusion of thermally conductive material having an interior surface, an exterior surface, at least a portion of the exterior surface defining a substantially flat side that defines a plane oriented generally tangential to the tubular body;
   a plurality of internal fins extending from the interior surface of the tubular body;
   a fan adjacent to an open end of the tubular body to force ambient air through the tubular body;
   a circuit board having one end attached to the flat side of the tubular body such that the circuit board extends generally perpendicular to the flat side of the tubular body, the circuit board having a component attached thereto;
   a mounting ridge extending from the flat side of the tubular body and oriented generally perpendicular to the flat side of the tubular body such that the mounting ridge extends generally parallel to the circuit board; and
   a mounting clip having one end received by the mounting ridge and a second end contacting the component to retain the component against the flat side of the tubular body.

7. The heat sink assembly of claim 6, wherein the internal fins are arranged in a plurality of sets, with the internal fins of each set extending in parallel to varying lengths.

8. The heat sink assembly of claim 7, wherein the internal fins are generally symmetric around a center line of the tubular body.

9. The heat sink assembly of claim 8, wherein the fins in a center of a set are longer than the fins at an edge of a set.

10. The heat sink assembly of claim 6, further comprising a plurality of exterior fins extending from the exterior surface of the tubular body.

11. The heat sink assembly of claim 10, further comprising a fan positioned adjacent to an open end of the tubular body.

12. A cooktop comprising:
    a cooking plate;
    a plurality of heating units mounted below the cooking plate;
    a controller housing unit mounted below the cooking plate;
    a circuit board for controlling the heating units, the circuit board having a plurality of components, the circuit board mounted inside the controller housing unit;
    a heat sink assembly for cooling the plurality of components of the circuit board, the heat sink mounted inside the controller housing unit, the heat sink assembly having
      a tubular body formed from a single extrusion of thermally conductive material having an interior surface, an exterior surface and two open ends;
      a plurality of internal fins extending from the interior surface of the tubular body;
      a fan adjacent to one of the two open ends of the tubular body to force ambient air through the tubular body;
      the exterior surface of the tubular body defining at least one generally flat side defining a plane oriented generally tangential to the tubular body, the circuit board having one end connected to the flat side such that the circuit board extends generally perpendicular to the flat side of the tubular body, wherein the flat side contacts the plurality of components to remove heat from the components;
      a mounting ridge extending from the flat side of the tubular body and oriented generally perpendicular to the flat side of the tubular body such that the mounting ridge extends generally parallel to the circuit board; and
      a plurality of clips to hold the plurality of components against the flat side of the tubular body, each of the clips having a first end received by the mounting ridge and a second end contacting a respective component.

13. The cooktop of claim 12, wherein the internal fins are generally symmetric around a center line of the tubular body.

14. The cooktop of claim 13, wherein the fins in a center of a set are longer than the fins at the edge of a set.

15. The cooktop of claim 12, further comprising a plurality of exterior fins extending from the exterior surface of the tubular body.

16. The cooktop of claim 15, further comprising a fan positioned adjacent to an open end of the tubular body.

* * * * *